(12) United States Patent
Naidorf et al.

(10) Patent No.: US 10,622,982 B1
(45) Date of Patent: Apr. 14, 2020

(54) MEASUREMENT, CALIBRATION AND TUNING OF MEMORY BUS DUTY CYCLE

(71) Applicant: Western Digital Technologies, Inc., San Jose, CA (US)

(72) Inventors: Shlomo Naidorf, Nechalim (IL); David C. Brief, Modiin (IL); Yuval Grossman, Modiin (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/244,924

(22) Filed: Jan. 10, 2019

(51) Int. Cl.
*H03K 3/017* (2006.01)
*H03K 5/156* (2006.01)
*H03K 5/135* (2006.01)
*H03K 7/06* (2006.01)
*H03K 5/00* (2006.01)
*H03K 5/15* (2006.01)
*H03K 7/08* (2006.01)

(52) U.S. Cl.
CPC .......... *H03K 5/1565* (2013.01); *H03K 3/017* (2013.01); *H03K 5/00006* (2013.01); *H03K 5/135* (2013.01); *H03K 5/15046* (2013.01); *H03K 7/06* (2013.01); *H03K 7/08* (2013.01); *H03K 2005/00013* (2013.01)

(58) Field of Classification Search
CPC ........ H03K 5/1565; H03K 5/133; H03K 7/08; H04M 1/72527
See application file for complete search history.

(56) References Cited

U.S. PATENT DOCUMENTS 8,587,337 B1 * 11/2013 Shimanek ........ H03K 19/17736
326/37
2016/0105165 A1 * 4/2016 Shim .................... H03K 5/1565
327/175

* cited by examiner

*Primary Examiner* — Sibin Chen
(74) *Attorney, Agent, or Firm* — Patterson & Sheridan, LLP; Steven H. Versteeg

(57) ABSTRACT

A method and apparatus for dynamically monitoring, measuring, and adjusting a clock duty cycle of an operating storage device is disclosed. A storage device includes a measuring circuit comprising a plurality of flip flop registers coupled to a first input line, with each flip flop register having a first input and a second input. One or more delay taps are coupled to each flip flop register, and are disposed on a second input line. While the device operates, a clock signal is input directly into the first input of each flip flop register via the first input line. Simultaneously, the clock signal is input into the second input of each flip flop register through the one or more delay taps via the second input line. The flip flop registers are then read to determine the clock duty cycle of the device, and the clock frequency is adjusted as needed.

13 Claims, 5 Drawing Sheets

MEASUREMENT, CALIBRATION AND TUNING OF MEMORY BUS DUTY CYCLE

BACKGROUND OF THE DISCLOSURE

Field of the Disclosure

Embodiments of the present disclosure generally relate to storage devices, such as solid state devices (SSDs).

Description of the Related Art

During operation of a data storage device, such as an SSD, data may be communicated between a controller and a memory of the data storage device via a high speed parallel data bus that couples the controller and the memory. For example, one or more data values may be provided to or received from the data bus at a transfer rate based on a frequency of a clock signal. To illustrate, a first data value may be provided to the data bus from the controller in response to a rising edge or a falling edge of the clock signal.

As device performance is pushed higher and higher, the clock signal frequency requirements may increase and device environmental conditions, such as the temperature and supply voltage, may change. Such changes may cause bus signal characteristics, such as setup time and hold time, to degrade. The degradation of the bus signal characteristics limits the maximal clock signal frequency, which in turn limits the system performance in some data use cases. As such, the clock duty cycle of the device may become off margin, requiring the clock duty cycle to be calibrated in order to achieve higher device performance.

However, calibrating the clock duty cycle of a device can be difficult. Measuring the clock duty cycle at manufacturing may allow tuning the device configurations, but requires larger design margins that increase costs and lower device performance. Measuring the clock duty cycle at manufacturing further requires potential changes to the environmental conditions to be taken into account prior to occurring, which may be less accurate and require additional margins. Other clock duty cycle calibrations require the storage device to stop operation in order to run various training sequences, which prohibits the use of the storage device until reconfiguration is complete.

Therefore, there is a need in the art for a data storage device having a clock duty cycle able to be dynamically calibrated.

SUMMARY OF THE DISCLOSURE

A method and apparatus for dynamically monitoring, measuring, and adjusting a clock duty cycle of an operating storage device is disclosed. A storage device includes a measuring circuit comprising a plurality of flip flop registers coupled to a first input line, with each flip flop register having a first input and a second input. One or more delay taps are coupled to each flip flop register, and are disposed on a second input line. While the device operates, a clock signal is input directly into the first input of each flip flop register via the first input line. Simultaneously, the clock signal is input into the second input of each flip flop register through the one or more delay taps via the second input line. The flip flop registers are then read to determine the clock duty cycle of the device, and the clock frequency is adjusted as needed.

In one embodiment, a storage device comprises one or more memory devices, a controller coupled to the one or more memory devices, and a measuring circuit coupled to the controller. The measuring circuit comprises a plurality of consecutive delay taps and a plurality of flip flop registers. Each flip flop register of the plurality of flip flop registers comprises a first input and a second input. The measuring circuit further comprises a first input line coupled directly to the first input of each flip flop register of the plurality of flip flop registers. The measuring circuit further comprises a second input line coupled to the second input of each flip flop register of the plurality of flip flop registers through consecutive delay taps of the plurality of consecutive delay taps, each consecutive delay tap having a constant delay, and a measurement signal configured to enable a measurement of a clock duty cycle of the measuring circuit.

In another embodiment, a method of operating a storage device comprises inputting a first signal into a plurality of flip flop registers of a measuring circuit, the first signal being directly input into a first input of each of the flip flop registers of the plurality of flip flop registers. The method further comprises inputting, simultaneously, a second signal into a plurality of delay taps. One or more delay taps are coupled to each of the flip flop registers of the plurality of flip flop registers. The second signal passes through each of the one or more delay taps to a second input of each flip flop register of the plurality of flip flop registers. The method further comprises reading the plurality of flip flop registers to measure a clock duty cycle, and calibrating the clock duty cycle in response to the measurement while operating the storage device.

In another embodiment, a method of operating a storage device comprises switching the storage device to an active state, measuring a clock duty cycle of the storage device using a measuring circuit comprised of a plurality of flip flop registers coupled to a chain of delay taps, determining a value that the clock duty cycle has changed, determining a configuration value to calibrate the clock duty cycle, calibrating the clock duty cycle, and measuring the clock duty cycle using the measuring circuit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

A method and apparatus for dynamically monitoring, measuring, and adjusting a clock duty cycle of an operating storage device is disclosed. A storage device includes a measuring circuit comprising a plurality of flip flop registers coupled to a first input line, with each flip flop register having a first input and a second input. One or more delay taps are coupled to each flip flop register, and are disposed on a second input line. While the device operates, a clock signal is input directly into the first input of each flip flop register via the first input line. Simultaneously, the clock signal is input into the second input of each flip flop register through the one or more delay taps via the second input line. The flip flop registers are then read to determine the clock duty cycle of the device, and the clock frequency is adjusted as needed.

Figure 1:
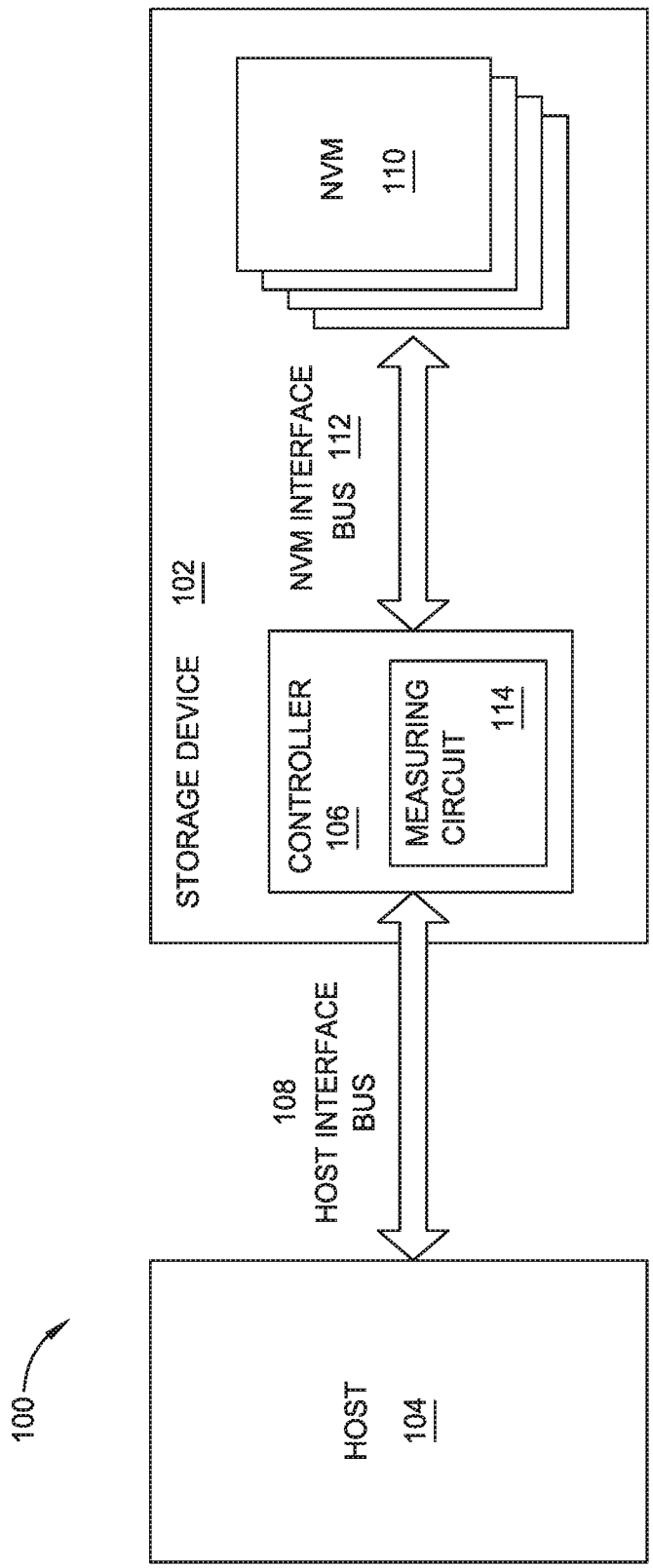
FIG. 1 illustrates a schematic storage system, according to one embodiment.

FIG. 1 illustrates a schematic storage system 100, according to one embodiment. The storage system 100 comprises a host device 104 coupled to a storage device 102. The host device 104 may store and/or retrieve data to and/or from one or more storage devices, such as the storage device 102. As illustrated in FIG. 1, the host device 104 may communicate with the storage device 102 via a host interface bus 108, such as a host interface bus. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

The storage device 102 comprises a controller 106 that is communicatively coupled to the host device 104 via the host interface bus 108. The controller 106 of the storage device 102 is further coupled to non-volatile memory (NVM) 110, such as flash memory devices or dies, via an NVM interface bus 112. The NVM interface bus 112 (i.e. the memory interface) comprises a data bus. In one embodiment, the NVM interface bus 112 comprises a flash interface data bus. In some examples, the storage device 102 may include additional components not shown in FIG. 1 for sake of clarity. For example, the storage device 102 may include a printed board (PB) to which components of the storage device 102 are mechanically attached and which includes electrically conductive traces that electrically interconnect components of the storage device 102, or the like. In some examples, the physical dimensions and connector configurations of the storage device 102 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the storage device 102 may be directly coupled (e.g., directly soldered) to a motherboard of the host device 104.

The host interface bus 108 of the storage device 102 may include one or both of a data bus for exchanging data with the host device 104 and a control bus for exchanging commands with the host device 104. The host interface bus 108 may operate in accordance with any suitable protocol. For example, the host interface bus 108 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), or the like. The electrical connection of the host interface bus 108 (e.g., the data bus, the control bus, or both) is electrically connected to the controller 106, providing electrical connection between the host device 104 and the controller 106, allowing data to be exchanged between the host device 104 and the controller 106. In some examples, the electrical connection of the host interface bus 108 may also permit the storage device 102 to receive power from the host device 104.

The storage device 102 includes NVM 110, which may include a plurality of memory devices. NVM 110 may be configured to store and/or retrieve data. For instance, a memory device of NVM 110 may receive data and a message from the controller 106 that instructs the memory device to store the data. Similarly, the memory device of NVM 110 may receive a message from the controller 106 that instructs the memory device to retrieve data. In some examples, each of the memory devices may be referred to as a die. In some examples, a single physical chip may include a plurality of dies (i.e., a plurality of memory devices). In some examples, each memory devices may be configured to store relatively large amounts of data (e.g., 128 MB, 256 MB, 412 MB, 1 GB, 2 GB, 3 GB, 8 GB, 16 GB, 32 GB, 24 GB, 128 GB, 256 GB, 412 GB, 1 TB, etc.).

In some examples, each memory device of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

NVM 110 may comprise one or more flash memory devices. Flash memory devices may include NAND and NOR based flash memory devices, and may store data based on a charge contained in a floating gate of a transistor for each flash memory cell. In some flash memory devices, such as NAND memory devices, the flash memory device may be divided into a plurality of blocks which may divided into a plurality of pages. Each block may include 128 KB of data, 256 KB of data, 2 MB of data, 8 MB of data, etc. In some instances, each page may include 1 kilobyte (KB) of data, 3 KB of data, 8 KB of data, etc.

The controller 106 of the storage device 102 may manage one or more operations of the storage device 102. For instance, the controller 106 may manage the reading of data from and/or the writing of data to NVM 110 via the NVM interface bus 112. In some embodiments, when the storage device 102 receives a write command from the host device 104, the controller 106 may initiate a data storage command to store data to NVM 110 and monitor the progress of the data storage command. The controller 106 may determine at least one operational characteristic of the storage system 100 and store the at least one operational characteristic to NVM 110. The controller 106 further comprises a measuring circuit 114. The measuring circuit 114 is configured to monitor, measure, and adjust a clock duty cycle of the storage device 102.

Figure 2:
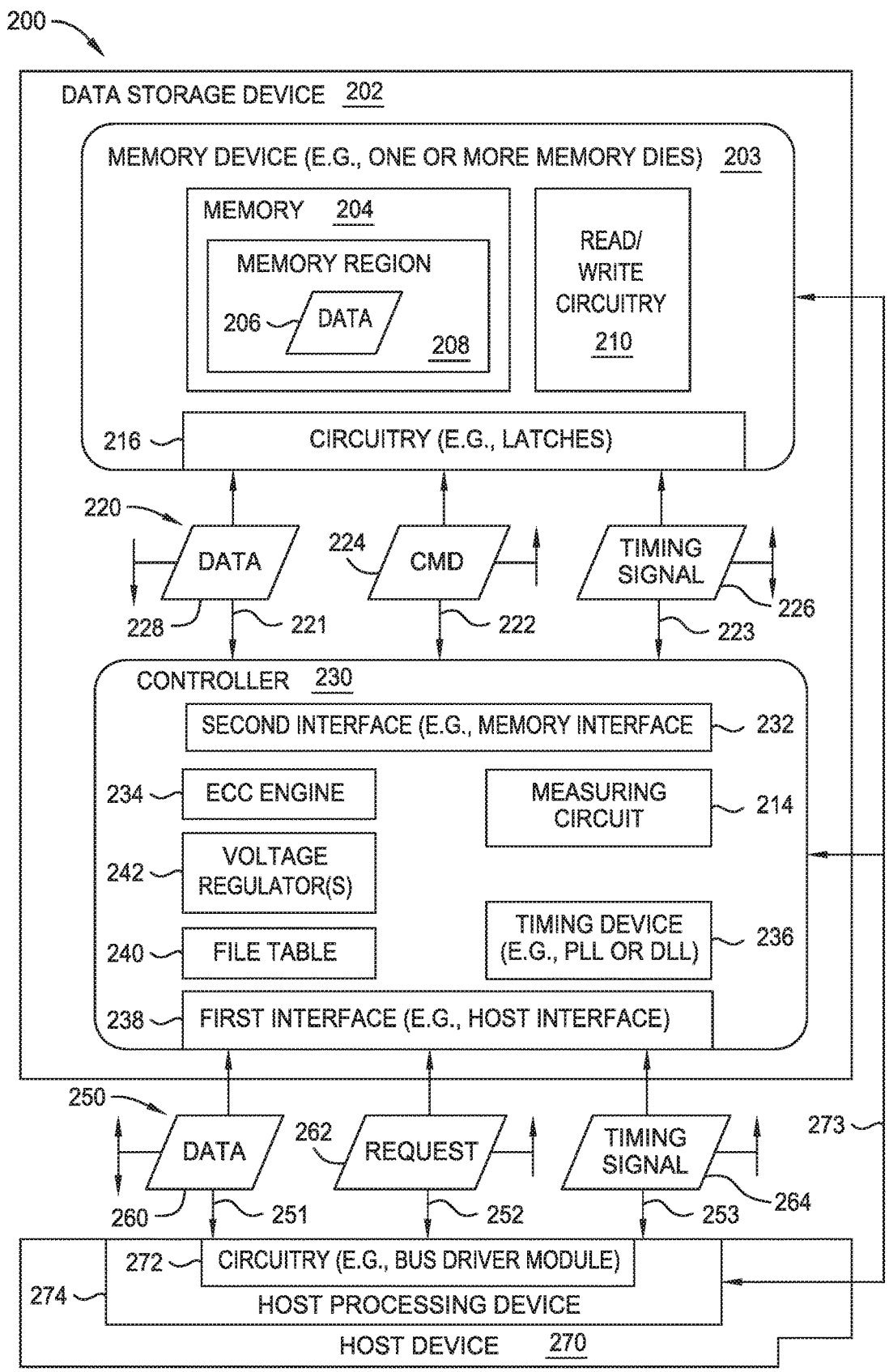
FIG. 2 depicts an illustrative example of a data storage system, according to another embodiment.

FIG. 2 depicts an illustrative example of a data storage system 200, according to another embodiment. The data storage system 200 includes a data storage device 202 coupled to a host device 270. The data storage device 202 may be the storage device 102 of FIG. 1, and the host device 270 may be the host device 104 of FIG. 1.

The data storage device 202 may include a memory device, such as a memory device 203. The memory device 203 may include one or more memory dies (e.g., one memory die, two memory dies, eight memory dies, or another number of memory dies). The memory device 203 includes a memory 204, such as a non-volatile memory of storage elements included in a memory die of the memory device 203. The memory 204 may be the NVM 110 of FIG. 1. For example, the memory 204 may include a flash memory, such as a NAND flash memory, or a resistive memory, such as a resistive random access memory (ReRAM), as illustrative examples. The memory 204 may have a three-dimensional (3D) memory configuration. Alternatively, the memory 204 may have another configuration, such as a two-dimensional (2D) memory configuration or a non-monolithic 3D memory configuration (e.g., a stacked die 3D memory configuration).

The memory 204 may include one or more regions of storage elements (also referred to herein as memory cells), such as a memory region 208 for storing data 206. An example of a memory region is a block, such as a NAND flash erase group of memory elements. Another example of a memory region 208 is a word line of memory elements. Each memory element of the memory 204 may be programmable to a state (e.g., a threshold voltage in a flash configuration or a resistive state in a resistive memory configuration) that indicates one or more bit values.

The memory device 203 further includes read/write circuitry 210. The read/write circuitry 210 is configured to program values to storage elements of the memory 204 and to sense values from memory elements of the memory 204. The memory device 203 may further include circuitry 216 (e.g., one or more data latches, one or more control latches, or a combination thereof).

The data storage device 202 may further include a controller 230. The controller 230 may include a first interface 238 (e.g., a host interface), an error correction code (ECC) engine 234, a timing device 236, a second interface 232 (e.g., a memory interface), and one or more voltage regulators 242. To further illustrate, the first interface 238 may include one or more latches to receive data and commands from the host device 270, and the second interface 232 may include one or more bus drivers to send data and commands to the circuitry 216 of the memory device 203. The controller 230 may store (or access) a file table 240, such as a file allocation table (FAT). The controller 230 also includes a measuring circuit 214. The measuring circuit 214 may be the measuring circuit 114 of FIG. 1. The measuring circuit 214 is configured to monitor and measure a clock duty cycle of the data storage device 202.

The host device 270 may include circuitry 272. For example, the circuitry 272 may include one or more bus drivers. The circuitry 272 may be integrated within or coupled to a processor or controller of the host device 270, such as within a host processing device 274 (e.g., an application processor).

The data storage device 202 and the host processing device 274 are coupled via a connection 250 (e.g., a bus). The connection 250 may be the host interface bus 108 of FIG. 1. For example, FIG. 2 illustrates that the connection 250 may include one or more data lines 251, one or more control lines 252, and one or more timing signal lines 253. The connection 250 is coupled to the first interface 238 and to the circuitry 272.

The memory device 203 and the controller 230 are coupled via a connection 220 (e.g., a bus). The connection 220 may be the NVM interface bus 112 of FIG. 1. For example, FIG. 2 illustrates that the connection 220 may include one or more data lines 221, one or more control lines 222, and one or more timing signal lines 223. The connection 220 is coupled to the circuitry 216 and to the second interface 232.

In an illustrative implementation, the data storage system 200 further includes a power supply connection 273 (e.g., a "rail" to provide a power supply voltage, such as VDD, VCC, or both). The power supply connection 273 may be coupled to the memory device 203, the controller 230, and the host processing device 274. Depending on the particular implementation, the power supply connection 273 may be supplied by a battery (e.g., a mobile device battery) or by a power supply device (e.g., a transformer) coupled to a main power supply. In other implementations, the memory device 203, the controller 230, and/or the host processing device 274 are connected to separate power supply connections.

During operation, the controller 230 is configured to receive data and instructions from the host device 270 using the first interface 238. For example, the controller 230 may receive data 260 from the host device 270 via the first interface 238. To further illustrate, the data 260 may be received via the one or more data lines 251 in connection with a request 262 for write access sent via the one or more control lines 252. The data 260 and the request 262 may be received by the controller 230 based on a timing signal 264 (e.g., one or more clock signals, one or more strobe signals, or one or more read enable signals) received via the one or more timing signal lines 253. For example, the first interface 238 may include one or more latches to receive the data 260 based on the timing signal 264. Although FIG. 2 illustrates a single timing signal 264, it should be appreciated that more than one timing signal 264 may be used (e.g., a differential pair of timing signals).

The ECC engine 234 may be configured to receive the data 260 and to generate one or more ECC codewords based on the data 260. The ECC engine 234 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof.

The controller 230 is configured to send data and commands to the memory device 203 using the second interface 232 and to receive data from the memory device 203 using the second interface 232. For example, the controller 230 is configured to send data (e.g., one or more ECC codewords generated by the ECC engine 234) and a write command (e.g., a command 224) to cause the memory device 203 to store the data to a specified address of the memory 204. The write command may specify a physical address of a portion of the memory 204 that is to store the data.

To further illustrate, the controller 230 may send the data 228 to the memory device 203 via the one or more data lines 221 in connection with a write command sent via the one or more control lines 222. The memory device 203 may receive the data 228 and the write command 224 based on a timing signal 226 (e.g., one or more clock signals) provided by the controller 230 via the one or more timing signal lines 223. For example, the circuitry 216 may include one or more latches configured to receive the data 228 based on the timing signal 264. The memory device 203 may cause the read/write circuitry 210 to write the data 206 to the memory 204 based on the timing signal 226. Data 260, data 228, and data 206 may all be the same data at different locations within the system 200. Although FIG. 2 illustrates a single timing signal 226, it should be appreciated that more than one timing signal 226 may be used (e.g., a differential pair of timing signals). Further, in some cases, the timing signal 226 may include a signal generated by the memory device 203, such as a read enable signal.

The controller 230 is configured to send a read command (e.g., the command 224) to the memory device 203 to access data from a specified address of the memory 204. For example, the controller 230 may send the read command to the memory device 203 in response to receiving a request for read access from the host device 270. The read command may specify the physical address of a portion of the memory 204. For example, the read command may specify the physical address of a portion of the memory 204 storing the data 206. In response to the read command, the memory device 203 may cause the read/write circuitry 210 to sense the portion of the memory 204 storing the data 206 to generate sensed data (e.g., a representation of the data that may differ with respect to the data due to one or more bit errors).

The controller 230 is configured to receive the sensed data from the memory device 203 via the second interface 232. The controller 230 may input the sensed data to the ECC engine 234 to initiate a decoding process to correct one or more bit errors in the sensed data (if any) up to a particular error correction capability of the particular ECC technique. In response to decoding the sensed data, the ECC engine 234 may output the data 260. The controller 230 may provide the data 260 to the host device 270 using the first interface 238.

Figure 3A:
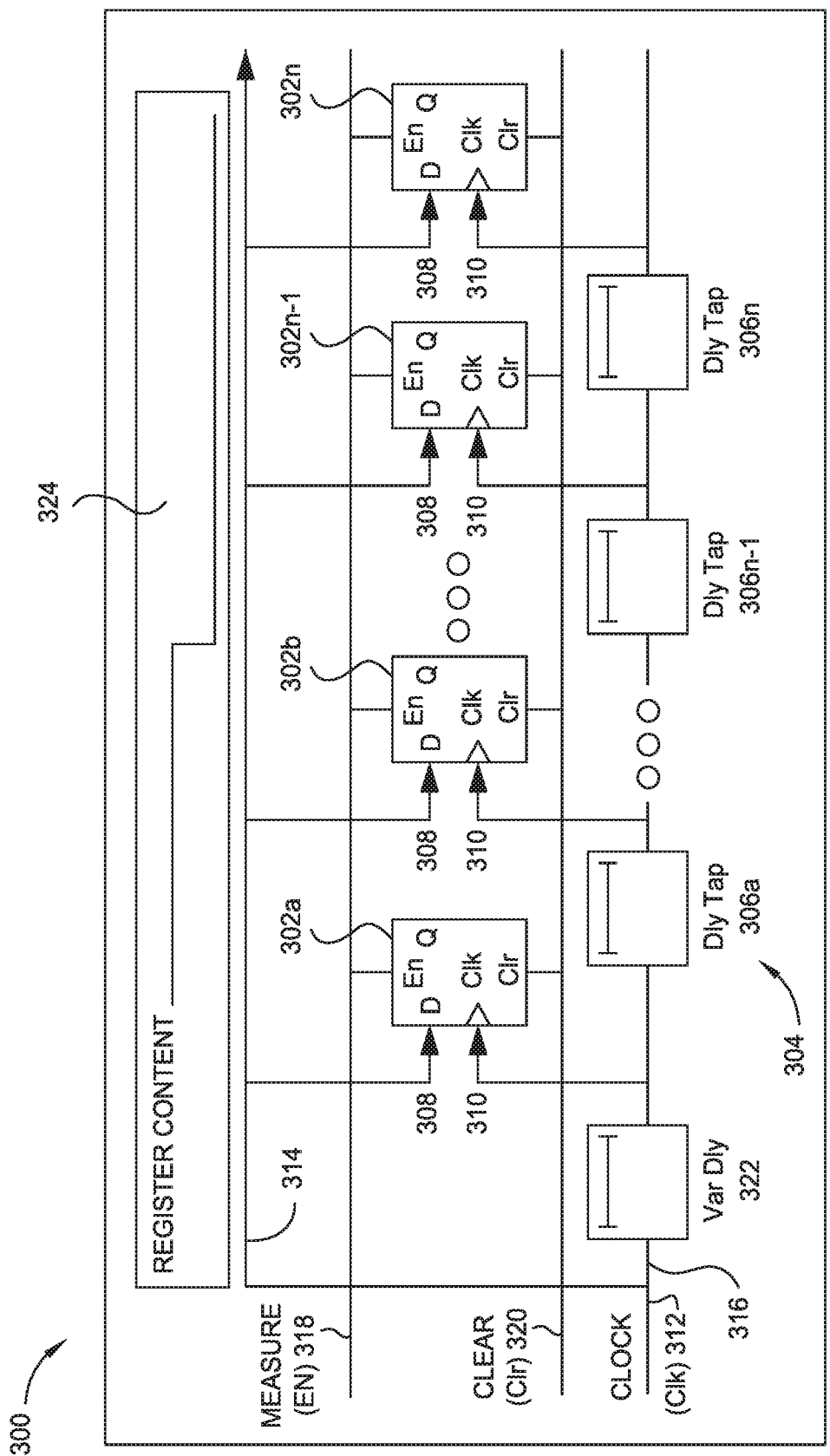
FIG. 3A illustrates a measuring circuit disposed in a storage device, according to one embodiment.

FIG. 3A illustrates a measuring circuit 300 disposed in a storage device, such as the storage device 102 of FIG. 1 or the storage device 202 of FIG. 2, according to one embodiment. The measuring circuit 300 is firmware-controlled, and is configured to dynamically monitor and measure a clock duty cycle of the storage device on-the-fly. The measuring circuit 300 may be the measuring circuit 114 disposed in the controller 106 of FIG. 1 or the measuring circuit 214 disposed in the controller 230 of FIG. 2.

The measuring circuit 300 comprises a plurality of flip flop registers 302a-302n coupled to a chain of delay taps 304. In one embodiment, 128 flip flop registers 302a-302n are included in the measuring circuit 300. The chain of delay taps 304 comprises a plurality of consecutive delay taps 306a-306n. Each delay tap 306a-306n of the chain of delay taps 304 has the same or constant delay. One or more delay taps 306a-306n are coupled between each of the flip flop register 302a-302n. In one embodiment, one delay tap 306a-306n is coupled between each of the flip flop registers 302a-302n.

Each flip flop register 302a-302n has a first input 308 and a second input 310. The first input 308 may be a data input and the second input 310 may be a clock input. A clock signal 312 (labeled Clk) is split into a first input line 314 and a second input line 316. Thus, the first input line 314 and the second input line 316 are the same clock signal 312. The first input line 314 is coupled directly to the first input 308 of each flip flop register 302a-302n. The second input line 316 is coupled to the second input 310 of each flip flop register 302a-302n through the chain of delay taps 304. Thus, the second input line 316 is coupled directly to the chain of delay taps 304. The chain of delay taps 304 is then coupled to the second input 310 of each flip flop register 302a-302n via the second input line 316. The second input line 316 being coupled to the chain of delay taps 304 comprising the plurality of consecutive delay taps 306a-306n each having a constant delay results in the clock signal 312 being delayed by a predetermined known amount of time. As such, the delayed clock signal of the second input line 316 is input into the second input 310 of each flip flop register 302a-302n after the first input line 314 has been input into the first input of each flip flop register 302a-302n.

The measuring circuit 300 further comprises a measurement signal 318 (labeled En) and a clear signal 320 (labeled Clr). The clear signal 320 is configured to reset or clear each of the flip flop registers 302a-302n prior to inputting the clock signal 312. Once the flip flop registers 302a-302n have been reset, the measurement signal 318 is enabled and the clock signal 312 is propagated through the circuit 300. Once the clock signal 312 has propagated though the plurality of flip flop registers 302a-302n, the measurement signal 318 is configured to enable the measurement by the flip flop registers 302a-302n for one cycle of the clock. The device firmware is then configured to read the flip flop registers 302a-302n to determine the clock duty cycle of the storage device.

Based on the reading of each flip flop register 302a-302n, a value that the clock duty cycle is off by, or the value by which the clock frequency should be adjusted, may be determined on-the-fly. For example, based on the measurement signal 318, a controller of the storage device is configured to dynamically determine whether the clock frequency (i.e. high time and/or the low time of the clock duty cycle) needs to be adjusted, and by how much. The clock frequency may be adjusted to achieve an optimal 50% clock duty cycle (i.e. 50/50 balance between high time and low time), as shown by the clock duty cycle illustrated by the optimal register content readout 324.

In one embodiment, the measuring circuit 300 further comprises a variable delay circuit 322 that is coupled to the second input line 316. In such an embodiment, the variable delay circuit 322 is disposed before the first delay tap 306a in the chain of delay taps 304. The variable delay circuit 322 may be used to delay the start of the sample window of the clock duty cycle in order to measure slower clocks.

Figure 3B:
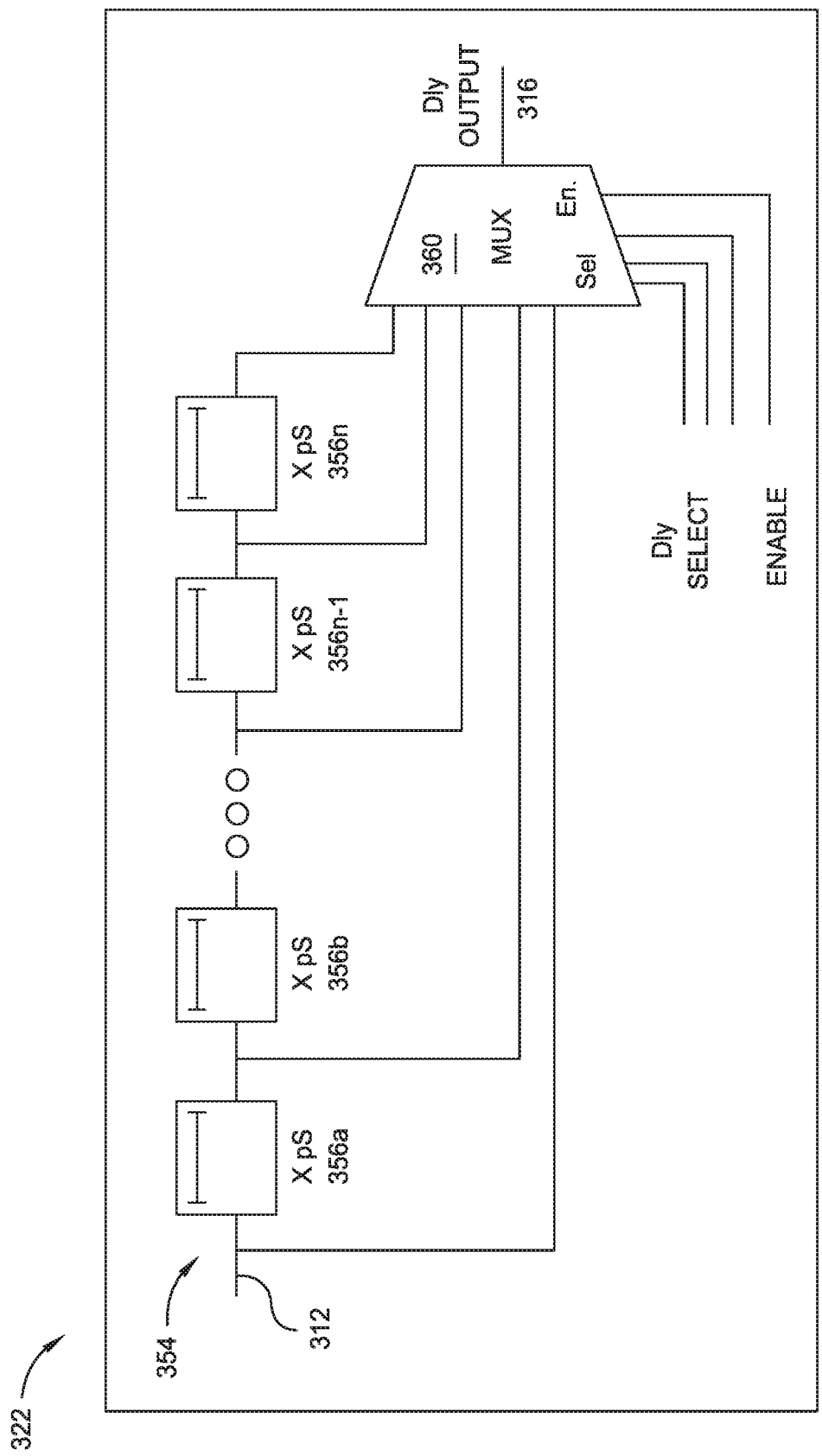
FIG. 3B illustrates a variable delay circuit disposed in a measuring circuit, according to one embodiment.

FIG. 3B illustrates a variable delay circuit 322 disposed in a measuring circuit, according to one embodiment. The variable delay circuit 322 comprises a chain of adjustable delay taps 354. The chain of adjustable delay taps 354 comprises a plurality of delay taps 356a-356n configured to adjust the amount of delay. The plurality of adjustable delay taps 356a-356n of the variable delay circuit 322 may delay the clock signal 312 by a smaller value or by a larger value than the chain of delay taps 304 of the measuring circuit 300. The value of delay added by the chain of adjustable delay taps 354 varies according to the time of the clock cycle to be measured. The delay of each adjustable delay tap 356a-356n in the chain of adjustable delay taps 354 may be adjusted such that the delay is suitable for the measured clocks. For each clock period, a different delay may be required, and adding a different amount of delay may enable the selection of a different clock period. The chain of adjustable delay taps 354 is coupled to a multiplexer 360, which is then coupled to the chain of delay taps 304 in the measuring circuit 300. The variable delay circuit 322 adds an incremental delay to the measurement of the clock duty cycle, moving the sample window of the cycle to allow the whole clock duty cycle to be captured in a few sample cycles. Thus, for slower clocks, the sample point is delayed, which permits the clock transition to be captured without using increasing the number of flip flop registers 302a-302n used in the measuring circuit 300. Utilizing the variable delay circuit 322 allows larger sampling windows to be measured with the same measuring circuit 300.

Figure 4:
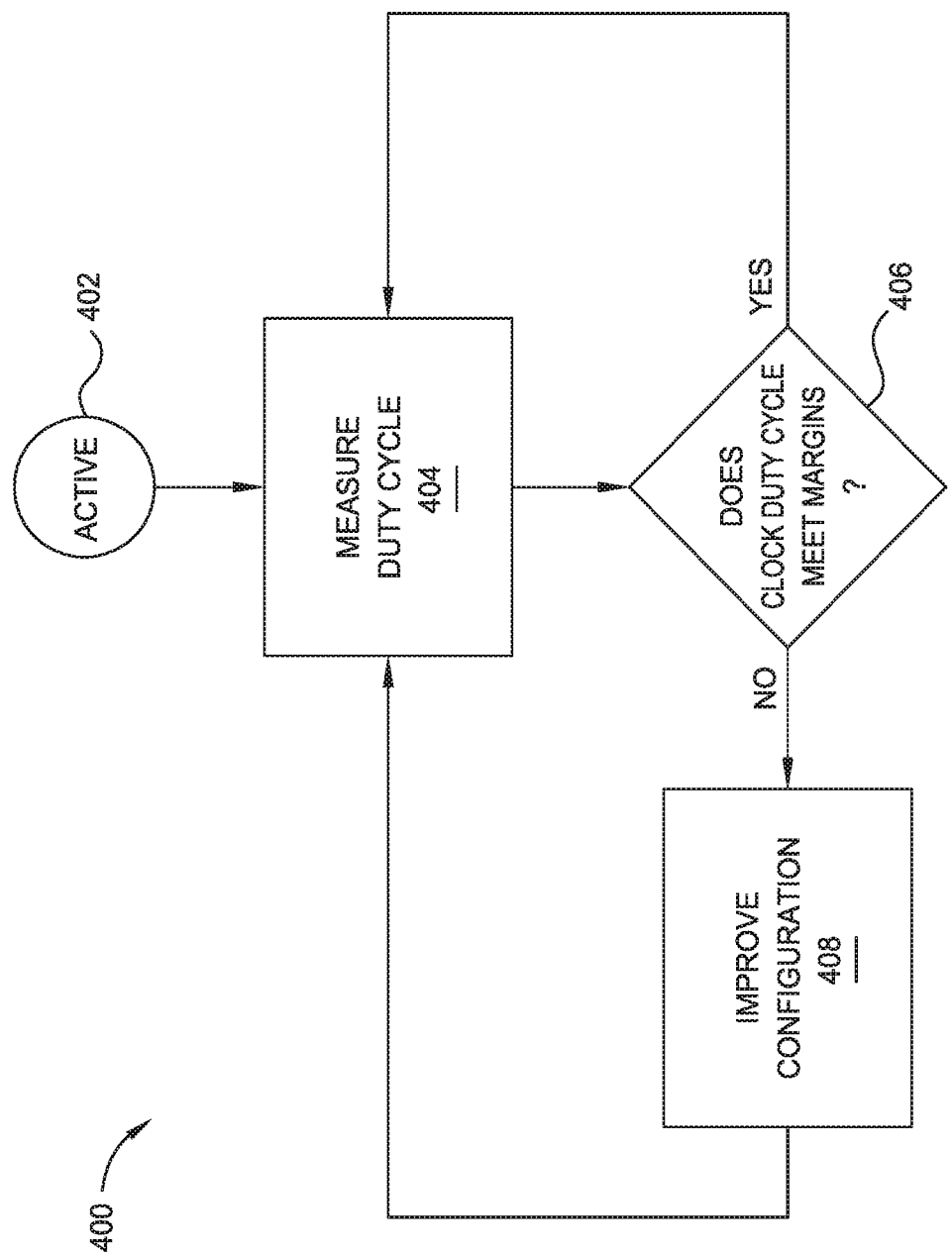
FIG. 4 illustrates a method of using a measuring circuit to monitor and measure a clock duty cycle of a storage device, according to one embodiment.

FIG. 4 illustrates a method 400 of utilizing a measuring circuit to monitor, measure, and calibrate a clock duty cycle of a storage device, according to one embodiment. Method 400 may be used with the measuring circuit 300 of FIG. 3A. For clarity, the method 400 of FIG. 4 will be described with reference to the measuring circuit 300 of FIG. 3A.

In operation 402, the storage device is switched to an active state. An active state is one where the storage device is operating, such as performing reads and writes to and from non-volatile memory. The measuring circuit 300 is utilized to monitor and measure the clock duty cycle while the storage device is active and functioning.

Once the storage device is in active mode, method 400 proceeds to operation 404, where the clock duty cycle is measured. Measuring the clock duty cycle first comprises resetting the plurality of flip flop registers 302a-302n using the clear signal 320. Resetting the plurality of flip flop registers 302a-302n ensures each flip flop register 302a-302n starts off in the same first state, such as all being set to 0. The measurement signal 318 is then enabled for a single clock cycle. The clock signal 312 is then input, with the clock signal 312 traveling through the first input line 314 directly to the first input 308 of each flip flop register 302a-302n and through the second input line 316 through one or more consecutive delay taps 306a-306n to the second input 310 of each flip flop register 302a-302n.

Since the second input line 316 propagates through one or more consecutive delay taps 306a-306n prior to being input into the second input 310 of each flip flop register 302a-302n, the clock signal 312 of the second input line 316 is delayed, reaching the plurality of flip flop registers 302a-302n after the clock signal 312 of the first input line 314. Thus, when the clock signal 312 of the first input line 314 reaches each flip flop register 302a-302n, the flip flop registers 302a-302n are switched to a second state, such as 1 (i.e., switched from 0 to 1). When the clock signal 312 of the second input line 316 reaches each flip flop register 302a-302n after being input through the chain of delay taps 304, one or more flip flop registers 302a-302n are switched back to the first state (i.e., switched from 1 to 0). The clock signal 312 propagates through the chain of delay taps 304, triggering the switching of the flip flop registers 302a-302n sequentially. At the end of the clock cycle, each flip flop register 302a-302n holds the final state of the clock in delay tap timing until being reset.

In operation 406, each flip flop register 302a-302n is read to determine whether the clock duty cycle meets the desired margins. If the clock duty cycle meets the desired margins, method 400 proceeds back to operation 404, and the measuring circuit 300 continues to monitor and measure the clock duty cycle. If the clock duty cycle is determined to be off margin, method 400 proceeds to operation 408.

In operation 408, the configuration of the storage device is improved and/or calibrated. The transition where the clock duty cycle became off margin may be determined based on the reading of the flip flop registers 302a-302n. For example, the first flip flop register of the plurality of flip flop registers 302a-302n that failed to flip back to the first state after receiving the clock signal 312 from the second input line 316 may show where the transition occurred. As such, improving the configuration may comprise, based on the transition, determining the amount the clock duty cycle is off and a calibration value needed to adjust the clock duty cycle and increase signal integrity. The calibration value may be the value the frequency of the clock signal should be adjusted in order to achieve the optimal 50% clock duty cycle. Furthermore, based on the transition location and the reading of the plurality of flip flop registers 302a-302n, of the setup and hold times may be continuously monitored as well.

The clock duty cycle is then dynamically calibrated on-the-fly while the storage device is still in the active state based on the calibration value. Calibrating the storage device may include adjusting the clock frequency. The storage device operations need not be stopped in order to calibrate the clock duty cycle. Once the clock duty cycle is calibrated, method 400 proceeds back to operation 404, and the measuring circuit 300 continues to monitor and measure the clock duty cycle. Since storage devices are vulnerable to environmental changes such as temperature and supply voltage, the devices may need to be consistently monitored. Thus, method 400 may repeat one or more times in order to continuously monitor the clock duty cycle without interrupting storage device operations.

Utilizing the measuring circuit comprised of a plurality of flip flop registers and delay taps allows the clock duty cycle of a storage device to be continuously monitored and measured as the device is operating without performance degradation. If the clock duty cycle is determined to be off margin, the transition location may be determined such that the timing of the error may then be determined with relative exactness, and the storage device may be dynamically and accurately configured with a calibration value based on the transition. Additionally, utilizing the measuring circuit comprised of a plurality of flip flop registers and delay taps allows continuous measurements of the setup and hold times per signal while the storage devices operates under normal conditions.

Furthermore, since the clock duty cycle is being monitored, any environmental changes that may affect the clock duty cycle or root causes of the clock duty cycle changing need not be individually monitored, allowing multiple root causes to be supported without increasing error margins or costs. As such, the measuring circuit enables the storage device to dynamically monitor, measure, and adjust the clock duty cycle as needed without interrupting device operations.

In one embodiment, a storage device comprises one or more memory devices, a controller coupled to the one or more memory devices, and a measuring circuit coupled to the controller. The measuring circuit comprises a plurality of consecutive delay taps and a plurality of flip flop registers. Each flip flop register of the plurality of flip flop registers comprises a first input and a second input. The measuring circuit further comprises a first input line coupled directly to the first input of each flip flop register of the plurality of flip flop registers. The measuring circuit further comprises a second input line coupled to the second input of each flip flop register of the plurality of flip flop registers through consecutive delay taps of the plurality of consecutive delay taps, each consecutive delay tap having a constant delay, and a measurement signal configured to enable a measurement of a clock duty cycle of the measuring circuit.

The measuring circuit may be configured to measure a clock duty cycle of the storage device. The measuring circuit may be configured to adjust a clock frequency of the storage device. The measuring circuit may further comprise a variable delay circuit. The variable delay circuit may be coupled to the second input line. The second input line may be coupled to the consecutive delay taps through the variable delay circuit. The variable delay circuit may comprise a plurality of delay taps. The variable delay circuit may be configured to increase a delay to a signal input into the second input line. The same clock signal may be input into both the first input line and the second input line.

In another embodiment, a method of operating a storage device comprises inputting a first signal into a plurality of flip flop registers of a measuring circuit, the first signal being directly input into a first input of each of the flip flop registers of the plurality of flip flop registers. The method further comprises inputting, simultaneously, a second signal into a plurality of delay taps. One or more delay taps are coupled to each of the flip flop registers of the plurality of flip flop registers. The second signal passes through each of the one or more delay taps to a second input of each flip flop register of the plurality of flip flop registers. The method further comprises reading the plurality of flip flop registers to measure a clock duty cycle, and calibrating the clock duty cycle in response to the measurement while operating the storage device.

The method may further comprise resetting the plurality of flip flop registers before inputting the first signal. The measuring circuit may further comprise a variable delay circuit coupled to the plurality of delay taps. The plurality of flip flop registers may be measured using a measurement signal of the measuring circuit. The first signal and the second signal may be a clock signal. The method may further comprise switching the storage device to an active state before inputting the first signal. Calibrating the clock duty cycle may comprise adjusting a clock frequency of the storage device.

In another embodiment, a method of operating a storage device comprises switching the storage device to an active state, measuring a clock duty cycle of the storage device using a measuring circuit comprised of a plurality of flip flop registers coupled to a chain of delay taps, determining a value that the clock duty cycle has changed, determining a configuration value to calibrate the clock duty cycle, calibrating the clock duty cycle, and measuring the clock duty cycle using the measuring circuit.

The measuring circuit may further comprise a first clock signal coupled directly to a first input of each flip flop register of the plurality of flip flop registers and a chain of delay taps comprising a plurality of delay taps. One or more delay taps from the chain of delay taps may be coupled to each flip flop register of the plurality of flip flop registers. The measuring circuit may further comprise a second clock signal coupled to a second input of each flip flop register of the plurality of flip flop registers through the chain of delay taps. The first clock signal and the second clock signal may be the same clock signal. The measuring circuit may further comprise a measurement signal, and a variable delay circuit coupled to the beginning of the chain of delay taps. The method may further comprise continuously monitoring the clock duty cycle while the storage device is in the active state. Calibrating the clock duty cycle may comprise adjusting a clock frequency of the storage device.

While the foregoing is directed to embodiments of the present disclosure, other and further embodiments of the disclosure may be devised without departing from the basic scope thereof, and the scope thereof is determined by the claims that follow.

What is claimed is:

1. A storage device, comprising:
   one or more memory devices;
   a controller coupled to the one or more memory devices; and
   a measuring circuit coupled to the controller, the measuring circuit comprising:
      a plurality of consecutive delay taps;
      a plurality of flip flop registers, wherein each flip flop register of the plurality of flip flop registers comprises a first input and a second input;
      a first input line coupled directly to the first input of each flip flop register of the plurality of flip flop registers;
      a second input line coupled to the second input of each flip flop register of the plurality of flip flop registers through consecutive delay taps of the plurality of consecutive delay taps, wherein each consecutive delay tap has a constant delay;
   a variable delay circuit coupled to the second input line, wherein the variable delay circuit is disposed before a first delay tap of the plurality of consecutive delay taps; and
   a measurement signal configured to enable a measurement of a clock duty cycle of the measuring circuit.

2. The storage device of claim 1, wherein the measuring circuit is configured to measure a clock duty cycle of the storage device.

3. The storage device of claim 2, wherein the measuring circuit is configured to adjust a clock frequency of the storage device.

4. The storage device of claim 1, wherein the variable delay circuit comprises a plurality of delay taps.

5. The storage device of claim 4, wherein the variable delay circuit is configured to increase a delay to a signal input into the second input line.

6. The storage device of claim 1, wherein the second input line is coupled to the consecutive delay taps through the variable delay circuit.

7. The storage device of claim 1, wherein the same clock signal is input into both the first input line and the second input line.

8. A method of operating a storage device, comprising:
   inputting a first signal into a plurality of flip flop registers of a measuring circuit, the first signal being directly input into a first input of each of the flip flop registers of the plurality of flip flop registers;
   inputting, simultaneously, a second signal into a plurality of delay taps, wherein one or more delay taps are coupled to each of the flip flop registers of the plurality of flip flop registers, and wherein the second signal passes through each of the one or more delay taps to a second input of each flip flop register of the plurality of flip flop registers, wherein a variable delay circuit is coupled to the second input line, wherein the variable delay circuit is disposed before a first delay tap of the one or more delay taps;

reading the plurality of flip flop registers to measure a clock duty cycle; and calibrating the clock duty cycle in response to the measurement while operating the storage device.

9. The method of claim 8, further comprising resetting the plurality of flip flop registers before inputting the first signal.

10. The method of claim 8, wherein the plurality of flip flop registers is measured using a measurement signal.

11. The method of claim 8, wherein the first signal and the second signal are a clock signal.

12. The method of claim 8, further comprising switching the storage device to an active state before inputting the first signal.

13. The method of claim 8, wherein calibrating the clock duty cycle comprises adjusting a clock frequency of the storage device.

\* \* \* \* \*